PARAMETRIC AMPLIFIER CIRCUIT FOR MICROWAVE FREQUENCIES
Filed May 29, 1969
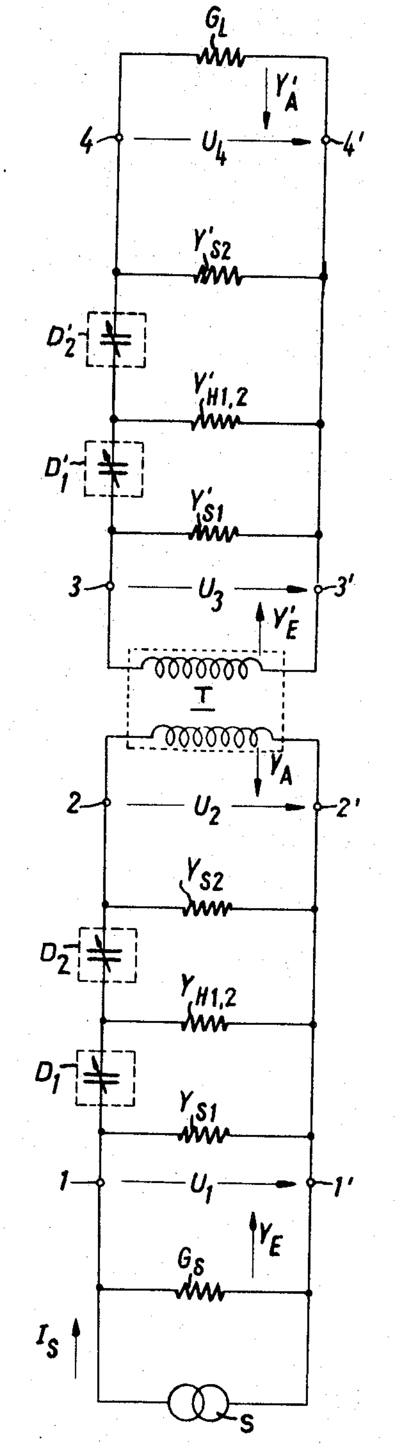
INVENTORS
Karl-Heinz Löcherer &
Robert Maurer
BY Spencer & Kaye
ATTORNEYS United States Patent Office 3,562,657

Patented Feb. 9, 1971

3,562,657
PARAMETRIC AMPLIFIER CIRCUIT FOR MICROWAVE FREQUENCIES

Karl-Heinz Löcherer, Ulm (Danube), and Robert Maurer, Neureut, near Karlsruhe, Germany, assignors to Telefunken Patentverwertungsgesellschaft m.b.H., Ulm (Danube), Germany Filed May 29, 1969, Ser. No. 828,898
Claims priority, application Germany, June 1, 1968, P 17 66 501.9
Int. Cl. H03f 7/04
U.S. Cl. 330—4.9 8 Claims

ABSTRACT OF THE DISCLOSURE

A nonreciprocal parametric microwave frequency amplifier circuit composed of two mixer cascade amplifiers connected in series and presenting simultaneous power and noise matching by an appropriate selection of the electrical values of the circuit.

BACKGROUND OF THE INVENTION

The present invention relates to parametric amplifiers, and particularly to amplifiers for use in the microwave frequency range.

One type of parametric amplifier which is already known in the art is a mixer cascade amplifier composed of a parametric up-converter connected in cascade with a parametric down-converter, each converter having an associated reactance diode and the two diodes receiving pump signals which are out of phase with respect to one another. Such an amplifier further includes a passive reciprocal two-terminal component whose value is selected so that it compensates the feed back susceptance of the amplifier, this component being connected between the amplifier input and output.

For amplifiers which are intended to operate at low frequencies, it is known to achieve a noise matching for the amplifier by means of a so-called intermediate base circuit. However, such a circuit cannot be employed in amplifiers intended to operate at the high frequencies with which the invention is concerned.

To date, no effective way has been found for achieving simultaneous power and noise matching in microwave amplifier arrangements, and particularly in arrangements of the type described above.

SUMMARY OF THE INVENTION

It is a primary object of the present invention to overcome these drawbacks and difficulties.

Another object of the invention is to permit such simultaneous power and noise matching to be achieved.

Still another object of the invention is to provide a parametric microwave frequency amplifier having improved power transfer and noise matching characteristics.

A further object of the invention is to provide a device whose performance characteristic can be selectively varied in a simple manner.

These and other objects according to the invention are achieved by the provision of a novel microwave amplifier circuit including the first mixer cascade amplifier stage, a second mixer cascade amplifier stage having its input connected to the output of the first amplifier stage, a signal generator connected to the input of the first amplifier stage and a load element connected to the output of the second amplifier stage. Each amplifier stage has positive input and output admittances and is composed of pump frequency and signal means, a parametric up-converter, a parametric down-converter and a passive two-terminal susceptance compensating component connected between the input and output, each converter including a parametric diode, and the pump signal means being arranged to feed pump frequency signals to the diodes of the two converters so that such signals are out of phase with one another. To achieve the improved results according to the invention, the electrical values of the circuit are selected so that:

$$\frac{ReY'_A}{G_L}=1$$

$$\frac{1}{P_G}\leq\frac{ReY_E}{G_S}\leq 1, \text{ and}$$

$$P_G=P_{G1}\cdot P_{eff\,2}$$

where:

$ReY'_A$ is the real component of the output admittance of the circuit, $ReY_E$ is the real component of the input admittance of the circuit, $G_L$ is the conductance of the load element, $G_S$ is the conductance of the generator, $P_G$ is the power gain of the total amplifier cascade at resonance, $P_{G1}$ is the power gain of the first stage at resonance, and $P_{eff\,2}$ is the effective power gain of the second stage at resonance.

BRIEF DESCRIPTION OF THE DRAWINGS

The single drawing figure is a schematic diagram of the equivalent circuit of a preferred embodiment of the invention.

DESCRIPTION OF THE PREFERRED EMBODIMENTS

The circuit illustrated in the figure is composed of two mixer cascade amplifiers each composed of a parametric up-converter connected in cascade with a parametric down-converter. As is known, each converter includes a parametric diode to which is connected a pump frequency generator. The pump frequencies applied to the two diodes of each amplifier are generated so as to differ in phase from one another. Each amplifier includes a passive, reciprocal two-terminal component which is provided to compensate for the feed back susceptance of the amplifier, this component being connected between the input and the output terminals of the amplifier.

Each such mixer cascade amplifier constitutes a nonreciprocal amplifier circuit which is known to operate in such a manner that for a given resonance frequency power gain its minimum noise figure will coincide with that of a reflection amplifier of the type employing a circulator, as is described in Telefunken-Zeitung, volume 40, issue 1/2, pages 119–132 (1967). For achieving minimum noise in such a mixer cascade amplifier, a matching should be achieved with respect to the active power component by making the load conductance $G_L$ of the circuit equal to the real component of the circuit output admittance $ReY'_A$. In other words, the relationship $m_A=1$ should be achieved, where $$m_A=\frac{ReY'_A}{G_L} \qquad (1)$$

On the other hand, the minimization of noise requires a strong input mismatch, i.e. a clear difference between the real component of the input admittance of the circuit and the conductance presented by the signal generator. Specifically, if the matching ratio is expressed as $$m_E=\frac{ReY_E}{G_S} \qquad (2)$$

where $ReY_E$ is the real component of the circuit input admittance and $G_S$ is the signal generator conductance, the value of $m_E$ should be in the range between 1 and $1/P_G$, where $P_G$ is the total power gain of the circuit at its resonant frequency.

With these considerations in mind, the novel amplifier circuit according to the invention will now be described in detail.

The illustrated circuit includes a signal generator S connected across the circuit input terminals 1–1'. The generator appears to the circuit as a conductance $G_S$ and delivers thereto an input current $I_S$, while producing an input voltage $U_1$ between the terminals 1 and 1'.

The first stage of the microwave amplifier according to the invention, which stage is constituted by a mixer cascade amplifier of the type described above, is disposed between the input terminals 1–1' and the output terminals 2–2'. The input signal circuit of this stage is represented by the admittance $Y_{S1}$ and the output signal circuit thereof is represented by admittance $Y_{S2}$. The parametric diodes of the two converters constituting the first stage are represented by $D_1$ and $D_2$, these elements being shown as variable capacitors because in devices of this type the parametric diodes function essentially as such elements. The stage is completed by an admittance $Y_{H1,2}$ representing the two-terminal component which compensates for the susceptance of the stage at the upper and lower sideband. The output voltage $U_2$ of the stage appears between output terminals 2 and 2'. The input admittance for the stage is represented by $Y_E$, while the output admittance is indicated by $Y_A$, the directions in which these admittances are taken being represented by the associated arrows.

A second mixer cascade amplifier constitutes the second stage of the circuit according to the invention and is connected between the second stage input terminals 3–3' and the second stage output terminals 4–4'. The input terminals 3–3' are connected to the first stage output termnials 2–2' by a coupling transformer T.

The input signal circuit of the second stage is represented by the admittance $Y'_{S1}$, while the output signal circuit is represented by the admittance $Y'_{S2}$ and the compensating component for the lower and upper sideband is depresented by the admittance $Y'_{H1,2}$. The parametric diodes for the second stage are indicated by $D'_1$ and $D'_2$. The second stage has an input admittance $Y'_E$ and an output admittance $Y'_A$. The stage receives an input voltage $U_3$ between terminals 3 and 3' and produces an output voltage $U_4$ between the terminals 4 and 4', this output voltage being applied across the load conductance $G_L$ connected between terminals 4 and 4'.

For purposes of analysis, it will be assumed that the output of the second stage appears between terminals 3 and 3', so that the performance of the first stage includes the effect of transformer T.

Let it be assumed that each of the stages is reactively fully neutralized, that the signal circuits have no losses and that the ideal parametric diodes are employed. At resonance, for a given total power gain of $P_G$, which is equal to the product of the power gain $P_{G1}$ of the first stage (between terminals 1–1' and 3–3') and the effective power gain $P_{eff\ 2}$ of the second stage, the following relationships exist:

$$P_{G1}=\frac{|U_3|^2\cdot ReY'_E}{\frac{|I_S|^2}{4G_S}}=\frac{4P_G}{(1+m_E\cdot P_G)^2}$$

$$P_{eff\ 2}=\frac{|U_4|^2\cdot G_L}{|U_3|^2\cdot ReY'_E}=\frac{(1+m_E\cdot P_G)^2}{4} \quad (3)$$

where $ReY'_E$ is the real component of the second stage input admittance. The power standing wave ratio at the input of the first stage is represented by $m_E=ReY_E/G_S$, and $m_E=1$ represents the condition of power matching at the input of the first stage. Similarly, the power standing wave ratio at the output of the second stage is represented by $m_A=ReY'_A/G_L$, and the condition of power matching at the output of the second stage is represented by $m_A=1$.

For the power standing wave ratio $m_2$ at the terminals 2–2', or the power standing wave ratio $m_3$ at the terminals 3–3', the following relationship exists:

$$m_2=\frac{1}{m_3}=\frac{r^2Y'_A}{Y'_E} \quad (4)$$

where $r$ is the transformer voltage transformation ratio. The minimum additional noise figure $F_{A\ min}$ can be represented as:

$$F_A\ min=\frac{\Omega}{b-\Omega}\left(1-\frac{1}{P_G}\right)=\frac{\Omega}{b-\Omega}(1-m_E)+\frac{\frac{\Omega}{b-\Omega}\left(1-\frac{1}{m_E\cdot P_G}\right)}{\frac{1}{m_E}} \quad (5)$$

where $\Omega$ is the signal circuit frequency at resonance and $b$ is the pump circuit frequency. In Equation 5, the first term to the far right represents the contribution by the first stage and the second term to the far right represents the contribution of the second stage.

In order to achieve the minimum value $F_{A\ min}$, $m_A$ must equal 1. However, $m_E$ can have any arbitrarily selected value within the range:

$$\frac{1}{P_G}\leq m_E\leq 1 \quad (6)$$

Every individual value of $m_E$ has its own specific associated values for the generator and load conductance as well as for the resonant conductance $G_{H\omega}(H=b\pm\Omega)$ for the compensating circuits at the auxiliary frequencies $\omega i$. The relationships therebetween can be expressed as follows:

$$G_s=k_1\cdot\frac{4a1}{1-m_E} \quad (7)$$

$$G_L=k_4\cdot\frac{4a_2}{m_E\cdot P_G-1} \quad (8)$$

where:

$$a_1=\frac{b-s}{b+s}\cdot\frac{G_{H12,\ b+s}}{G_{H12,\ b-s}}=\frac{1-m_E}{1+3m_E};\ \text{as}\ s\rightarrow\Omega \quad (9)$$

$$a_2=\frac{b-s}{b+s}\cdot\frac{G'_{H12,\ b+s}}{G'_{H12,\ b-s}}=\frac{m_E\cdot P_G-1}{m_E\cdot P_G+3};\ \text{as}\ s\rightarrow\Omega \quad (10)$$

$$m_E\cdot P_G=m_2=\frac{1}{m_3} \quad (11)$$

$$k_1=\frac{s(b+s)\,|C_1^{(1)}|^2}{G_{H12,\ b+s}};\ \text{as}\ s\rightarrow\Omega \quad (12)$$

$$k_4=\frac{s(b+s|C'^{(1)}_2|^2}{G_{H12,\ b+s}};\ \text{as}\ s\rightarrow\Omega \quad (13)$$

where $C_i^{(1)}$ is the first Fourier component of the time-varying capacitance of the correspondingly designated parametric diode and $G_{H12}$ and $G'_{H12}$ are the conductances of the corresponding compensating components at the designated frequency $b+s$ or $b-s$.

Thus, the selection of such components in accordance with the above relationships will cause the resulting amplifier circuit to have the desired characteristics according to the invention.

The selection of the various component values according to the invention can, however, be modified in several ways. For example, it is possible, when creating the relationship:

$$m_E=\frac{2\cdot\sqrt{P_G}-1}{P_G} \quad (14)$$

to arrange the first stage of the amplifier arrangement to act as an isolator, i.e. so that $P_{G1}=1$.

According to a further embodiment of the invention, the various component values may be selected so that the second stage of the amplifier acts as an isolator, i.e. $P_{eff\ 2}=1$, when the following relationship is created:

$$m_E=\frac{1}{P_G} \quad (15)$$

In this case, the second stage will not make any contribution to the noise of the overall amplifier arrangement.

If, on the other hand, the following relationship is created:

$$m_E=\frac{2\sqrt[4]{P_G}-1}{P_G} \quad (16)$$

both stages can be made to contribute equally to the amplification by selecting the component values so that $P_{G1}=P_{eff\ 2}=\sqrt{P_G}$.

According to a particular embodiment of the invention, the amplifier arrangement can be constructed in such a manner that both stages will contribute equally to the total noise produced by the arrangement when the following relationship exists:

$$m_E=\frac{1+\frac{1}{P_G}}{2} \quad (17)$$

As another possibility, $m_E$ can be made equal to 1, i.e. establish an impedance power match at the input. In this case, the first stage will not make any contribution to the noise produced by the amplifier arrangements and neither of the stages will act as an isolator unless $P_G=1$.

The proper values for $G_S$, $G_L$ and $G_{H\omega}$ can be derived from the above equations.

According to a particularly advantageous feature of the invention, the amplifier arrangement can be so designed that each parametric diode together with its required positive components forms the desired system that is capable of resonance at the auxiliary frequencies, that is to say that the parasitic properties of the diodes, i.e. their associated series inductances, housing capacitances and series resistances together with their associated barrier layer capacitances, are properly selected and utilized as a positive part of the resulting circuits. Circuits in which the diodes are operated at their resonant frequencies present substantial simplifications with regard to the construction of the overall arrangement.

The two-terminal compensating component for each stage is preferably constituted by an inductance.

The amplifier circuit arrangement according to the present invention has the advantage of simultaneously providing a power and noise matching when the various components are given suitable values, and can preferably be used, due to its relatively simple construction and nonreciprocal behavior, as microwave input circuits, such as for television tuners, for example, in which a high insulation from undesired interference radiation at the input terminals is required.

It will be understood that the above description of the present invention is susceptible to various modifications, changes and adaptations.

We claim:

1. A microwave amplifier circuit comprising, in combination: a first mixer cascade amplifier stage; a second mixer cascade amplifier stage having its input connected to the output of said first amplifier stage, a signal generator connected to the input of said first amplifier stage; and a load element connected to the output of said second amplifier stage; each said amplifier stage having positive input and output admittances and being composed of pump frequency signal means, a parametric up-converter, a parametric down-converter and a passive two-terminal susceptance compensating component connected between the input and output, each said converter including a parametric diode, and said pump means being arranged to feed pump frequency signals to the diodes of said two converters so that such signals are out of phase with one another; wherein the electrical values of said circuit are selected so that:

$$\frac{ReY'_A}{G_L}=1$$

$$\frac{1}{P_G}\leq\frac{ReY_E}{G_S}\leq 1, \text{ and}$$

$$P_G=P_{G1}\cdot P_{eff\ 2}$$

where:

$ReY'_A$ is the real component of the output admittance of said circuit, $ReY_E$ is the real component of the input admittance of said circuit, $G_L$ is the conductance of said load element, $G_S$ is the conductance of said generator, $P_G$ is the power gain of the total amplifier cascade at resonance, $P_{G1}$ is the power gain of said first stage at resonance, and $P_{eff\ 2}$ is the effective power gain of said second stage at resonance.

2. An arrangement as defined in claim 1 wherein $$\frac{ReY_E}{G_S}=\frac{2\cdot\sqrt{P_G}-1}{P_G}$$

and $P_G$ is equal to 1, so that said first stage acts as an isolator.

3. An arrangement as defined in claim 1 wherein $$\frac{ReY_E}{G_S}=\frac{1}{P_G}$$

and $P_{eff\ 2}$ is equal to 1 so that said second acts as an isolator and makes no contribution to the overall noise in said circuit.

4. An arrangement as defined in claim 1 wherein both of said stages are arranged to contribute equally to the amplification produced by said circuit and $$\frac{ReY_E}{G_S}=\frac{2\sqrt[4]{P_G}-1}{P_G}$$

5. An arrangement as defined in claim 1 wherein both of said stages contribute equally to the total noise produced by said circuit and $$\frac{ReY_E}{G_S}=\frac{1+\frac{1}{P_G}}{2}$$

6. An arrangement as defined in claim 1 wherein $ReY_E=G_S$ so that the input of said circuit is matched and said first stage does not contribute to the overall noise produced in said circuit.

7. An arrangement as defined in claim 1 wherein said parametric diodes are constructed so that their parasitic electrical values form systems which are resonant at the desired auxiliary frequencies.

8. An arrangement as defined in claim 1 wherein each said compensating component is constituted by an inductor.

No references cited.

ROY LAKE, Primary Examiner

J. R. HOSTETTER, Assistant Examiner

U.S. Cl. X.R.

330—4.5